United States Patent [19]

Peters et al.

[11] Patent Number: 4,890,056
[45] Date of Patent: Dec. 26, 1989

[54] METHOD AND APPARATUS FOR ERROR CORRECTION OF PHASE MEASUREMENT SIGNALS

[75] Inventors: Jens Peters; Ludwig Becker, both of Hamburg, Fed. Rep. of Germany

[73] Assignee: Deutsches Electronen-Synchrotron DESY, Hamburg, Fed. Rep. of Germany

[21] Appl. No.: 295,340

[22] Filed: Jan. 10, 1989

[30] Foreign Application Priority Data

Jan. 16, 1988 [DE] Fed. Rep. of Germany ....... 3801154

[51] Int. Cl.$^4$ ............................................ G01R 25/00
[52] U.S. Cl. .................................................. 324/83 D
[58] Field of Search ................ 324/83 R, 83 D, 83 A; 364/481; 328/133; 307/511, 510, 516

[56] References Cited

U.S. PATENT DOCUMENTS

| | | | |
|---|---|---|---|
| 3,953,794 | 4/1976 | Moore | 328/133 |
| 4,178,631 | 12/1979 | Nelson, Jr. | 324/83 D |
| 4,506,333 | 3/1985 | Porrot et al. | 324/83 R |
| 4,654,586 | 3/1987 | Evans, Jr. et al. | 324/83 R |
| 4,700,129 | 10/1987 | Yoshizawa et al. | 324/83 R |

FOREIGN PATENT DOCUMENTS

| | | | |
|---|---|---|---|
| 0186521 | 7/1986 | European Pat. Off. | |
| 1020781 | 5/1983 | U.S.S.R. | 324/83 R |

*Primary Examiner*—Michael J. Tokar
*Assistant Examiner*—Louis M. Arana
*Attorney, Agent, or Firm*—Nixon & Vanderhye

[57] ABSTRACT

Non-linearities in phase detector output signals are digitally corrected as a function not only of the measured phase difference signal itself but also of the input signal amplitude(s) to the phase detector so that a desired degree of precision can be efficiently and conveniently maintained over the entire dynamic measurement range. Pre-stored digitized compensated output signals (or correction coefficients) are selected from a digital memory as a function of both the distorted phase measurement signal itself and the amplitude(s) of the signals being compared.

20 Claims, 3 Drawing Sheets

METHOD AND APPARATUS FOR ERROR CORRECTION OF PHASE MEASUREMENT SIGNALS

BACKGROUND OF THE INVENTION

1. Field of the Invention

This invention generally relates to the accurate measurement of phase difference between a pair of alternating current input signals. It is particularly adapted for use at high frequencies where one or both of the input signals is pulsed.

2. Related Prior Art

There are, of course, many known circuits for measuring phase difference between alternating current signals. A special subclass of such known circuits is also known for measuring the phase of pulsed high frequency signals. For example, reference may be had to the following publications:

1. Fox et al, "A Microprocessor Controlled Phase Measurement System For 2856 Mhz Pulses," 1982 IEEE MTTS International Microwave Symposium, Dallas, Tex., June 15-17, 1982, SLAC-PUB 2902, April 1982, 3 pages.
2. Aertech, "Polar Discriminators," a five-page sales brochure.

Fox et al specifically relates to the measurement of phase difference between pulsed high frequency signals. Such circuits are used, for example, for supervision of radar installations as well as for controlling pulsed high-frequency signals often used in linear accelerators and synchrotons for high energy physics applications. The Fox et al circuit uses phase shifters and mixers as well as related signal processors and is therefore relatively expensive—and temperature dependent with respect to several components distributed throughout the measurement circuit (e.g., mixers, phase shifters, etc).

Aertech uses a set of matched quadrature couplers and square law detectors to produce analog signals which may be used to control the x,y coordinates of an oscillograph so as to produce a polar coordinate display where the radius of a vector is proportional to amplitude and the angular location of the vector is proportional to the phase difference between two input signals.

There remains, however, need for a relatively efficient and highly accurate phase measurement method/apparatus which may utilized for high frequency pulse signals and which provides accurate outputs easily used in following analog or digital circuits.

SUMMARY OF THE INVENTION

In accordance with the exemplary embodiments of this invention, a conventional phase detector may be used even though it produces a distorted (e.g., non-linear) output signal as a function of actual phase difference between two input signals. However, compensated highly accurate phase measurement output signals nevertheless can be obtained as a function of both the distorted phase measurement signal itself and amplitude measurements related to the amplitude of at least one of the input signals.

Accordingly, instead of requiring matched high-frequency components, a properly programmed (e.g., as controlled by digital computer) multi-dimensional correction can be made in the distorted output of a conventional phase detector. In the preferred exemplary embodiments, such corrected (digital) outputs (or correction factors used to produce compensated outputs) are pre-calculated and stored in a suitable digital memory. The appropriate pre-stored digital output signal (or correction factor) is then looked up and output as a function of supplied multi-dimensional control parameters (e.g., the raw or distorted phase measurement as well as an amplitude measurement). The accuracies which can be achieved with this arrangement are, as a practical manner, limited only by the cost of the digital memory devices and the digitization errors (e.g., the errors involved in converting the phase detector output to digital form and/or in the computation and rounding of the pre-stored digital output signals and/or correction factors).

Since phase-sensitive, temperature-sensitive high-frequency electrical components used in the exemplary embodiment are located only in the phase detector itself (which can be of straightforward conventional design), it is possible to accommodate this limited temperature-sensitive phase detector circuitry entirely within a controlled temperature oven environment and thereby also tend to stabilize its output as a function of temperature. Alternatively, ambient temperature could be used as yet another dimension of the multi-dimensional control parameters used for looking up pre-stored compensated output signals (or compensating coefficients or factors).

In addition, in the exemplary embodiments, amplitude-related control data is preferably stored in a compressed format (e.g., by storing only predetermined ranges of amplitudes and/or by employing greater numbers of output signal increments where greater degrees of needed compensation are expected) so as to further enhance the overall precision of the compensated outputs. For example, pre-stored compensated phase-correction data is preferably changed more frequently (i.e., stored at shorter increments or intervals) within amplitude ranges having expected greater phase measurement distortion from the phase detector. In this manner, overall measuring accuracies on the order of 0.10 degree can be achieved for the final output phase measurements.

As should be appreciated, this invention can be used for phase measurements between either pulsed or non-pulsed signals or combinations of pulsed and non-pulsed input signals.

Soft and/or hard signal amplitude limiting circuits may also be employed at the phase detector inputs so as to further increase the usable dynamic range of the exemplary embodiments.

A second exemplary embodiment employs a phase detector of the type which produces a pair of output signals corresponding to the sine and cosine of the measured phase difference. In this embodiment, an amplitude-dependent signal may be obtained by squaring and summing such signals. A conventional resolver or converter circuit may also be used so as to derive the usual angular output measurement from the sine and cosine signals for subsequent use as in the first exemplary embodiment.

BRIEF DESCRIPTION OF THE DRAWINGS

These as well as other objects and advantages of this invention will be more completely understood and appreciated by studying the following detailed description of presently preferred exemplary embodiments taken in conjunction with the accompanying drawings, of which.

DETAILED DESCRIPTION OF EXEMPLARY EMBODIMENTS

Figure 1:
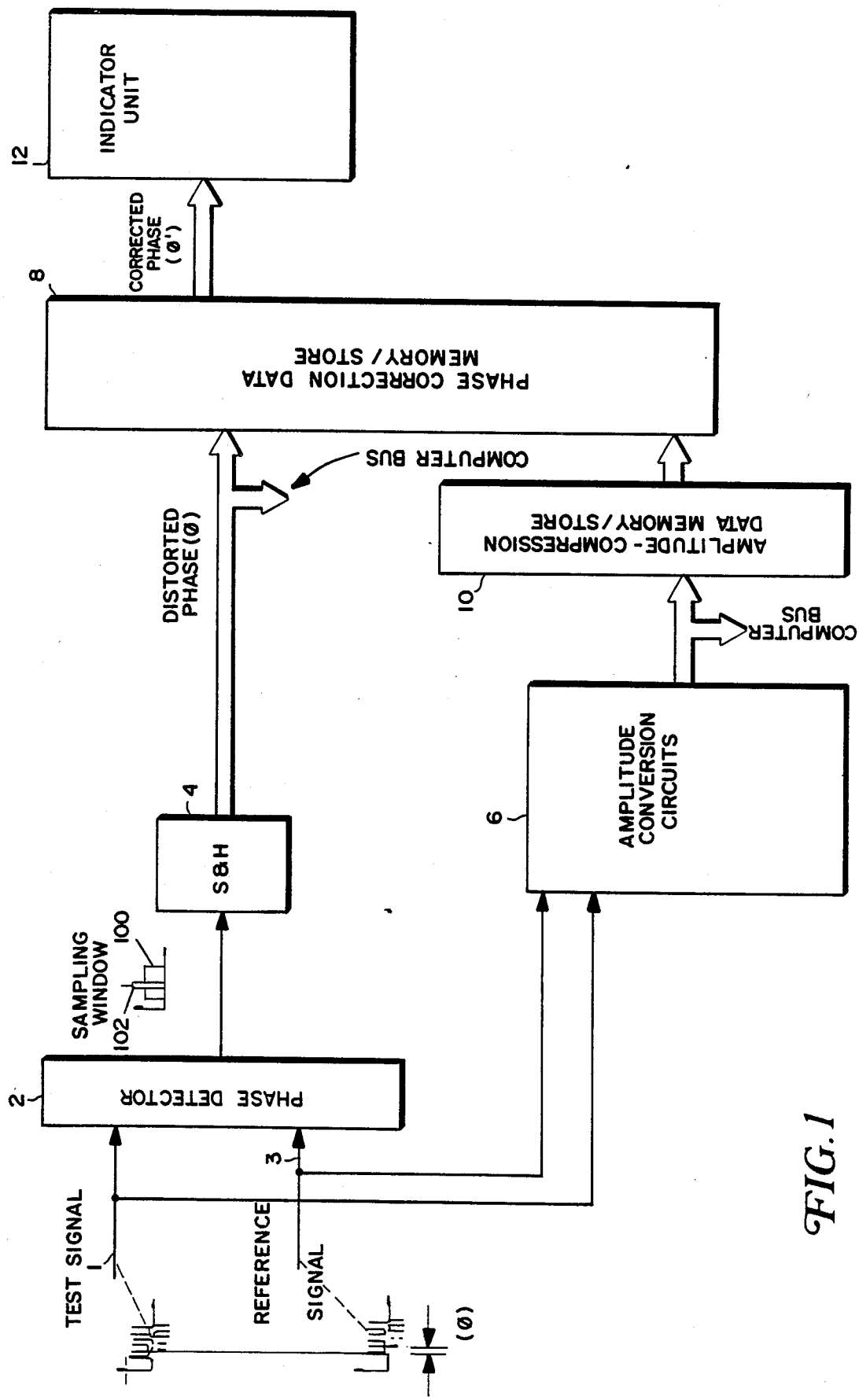
FIG. 1 is a block diagram of a first exemplary embodiment of this invention.

As shown in FIG. 1, phase detector 2 has a pair of inputs 1, 3 at which a test signal and a reference signal are respectively presented for the purpose of measuring the phase difference therebetween. Typically, the phase displacement of the test signal with respect to the reference signal may be represented by a phase angle $\phi$.

The phase detector 2 may be of almost any desired conventional type. It evaluates the phase difference $\phi$ in any known manner using mixer circuits or the like which are already known per se and which therefore need no further description. For example, if one puts two phase related signals into a typical mixer, on produces a signal proportional to sin $\phi$ (where $\phi$ is the phase difference between the two signals). Where one or both of the input signals is pulsed, then the output of phase detector 2 is typically also a pulsed d.c. voltage 100 as will be appreciated.

The amplitude of this d.c. pulse 100 may be captured for longer term observation and measurement by a conventional sample and hold circuit 4 having a sampling window 102 as depicted in FIG. 1. As will be appreciated, the position of the sampling window 102 can be controlled and adjusted (e.g., with respect to the leading edge of an input signal pulse), so as to fall virtually anywhere desired along the output pulse 100 of the phase detector 2. In this manner, the raw (distorted) $\phi$ measurement of the phase detector 2 is the amplitude of d.c. pulse 100 and it is captured for output (in either analog or digital form) by conventional sample and hold circuits 4.

As depicted in FIG. 1, the output of sample and hold circuit 4 also constitutes one dimension of the multidimensional control parameters used for addressing the phase correction data memory or store 8. As will be explained in more detail below, the pre-stored compensated $\phi'$ outputs (or correction coefficients) in memory 8 are selected for output to indicator unit 12 (or to any other desired using device) as a function of all the multidimensional control inputs (one of which is the output of sample and hold circuit 4).

In parallel to the above-discussed operations, both input signals are supplied to an amplitude conversion circuit 6 which determines the input signal amplitudes (in accordance with conventional known techniques) and outputs (in either analog or digital form) a corresponding signal to an amplitude-compression memory or store 10. Either or both of the input signal amplitudes can be measured and used as a control parameter. However, if the input reference signal amplitude is approximately constant, typically only the amplitude of the input test signal need be measured and used as a control parameter. In the amplitude-compression memory 10, a characteristic amplitude field is stored. Through control of the amplitude conversion circuit 6 output, one of those pre-stored characteristic amplitude signals in the amplitude-compression store 10 is selected (e.g., representing a predetermined range of output signals from the amplitude-conversion device 6). For example, for each range of input amplitudes, there may be a corresponding page of memory 8 in which all possible corrected output phases are stored in order of the measured (distorted) phase difference signal $\phi$. The amplitudes included within a given range are determined by the tolerable phase error which is dependent upon amplitude.

In this manner, it is possible to address the proper page of pre-stored compensated output signals in memory 8 so as to change the compensation more or less quickly according to the selected amplitude characteristic (e.g., range). In this way, the distorted $\phi$ input to the phase correction memory 8 can be used in conjunction with other dimensions of control (e.g., amplitude ranges) so as to produce a corrected $\phi'$ measurement output from memory 8 to be displayed by an indicator 12 or to be otherwise employed by utilization circuits (e.g., for controlling the phase of the test signal).

It should be noted that the signals provided to the inputs of memories 8 and 10 are preferably already in digital form. They, therefore, may be usefully connected to computer busses for conveniently effecting the necessary calibration processes which calculate and pre-store the corrected data in these memories as is generally indicated in FIG. 1. The memory circuits 8 and 10 typically may be, for example, EPROMS which are known and conventional per se.

Figure 2:
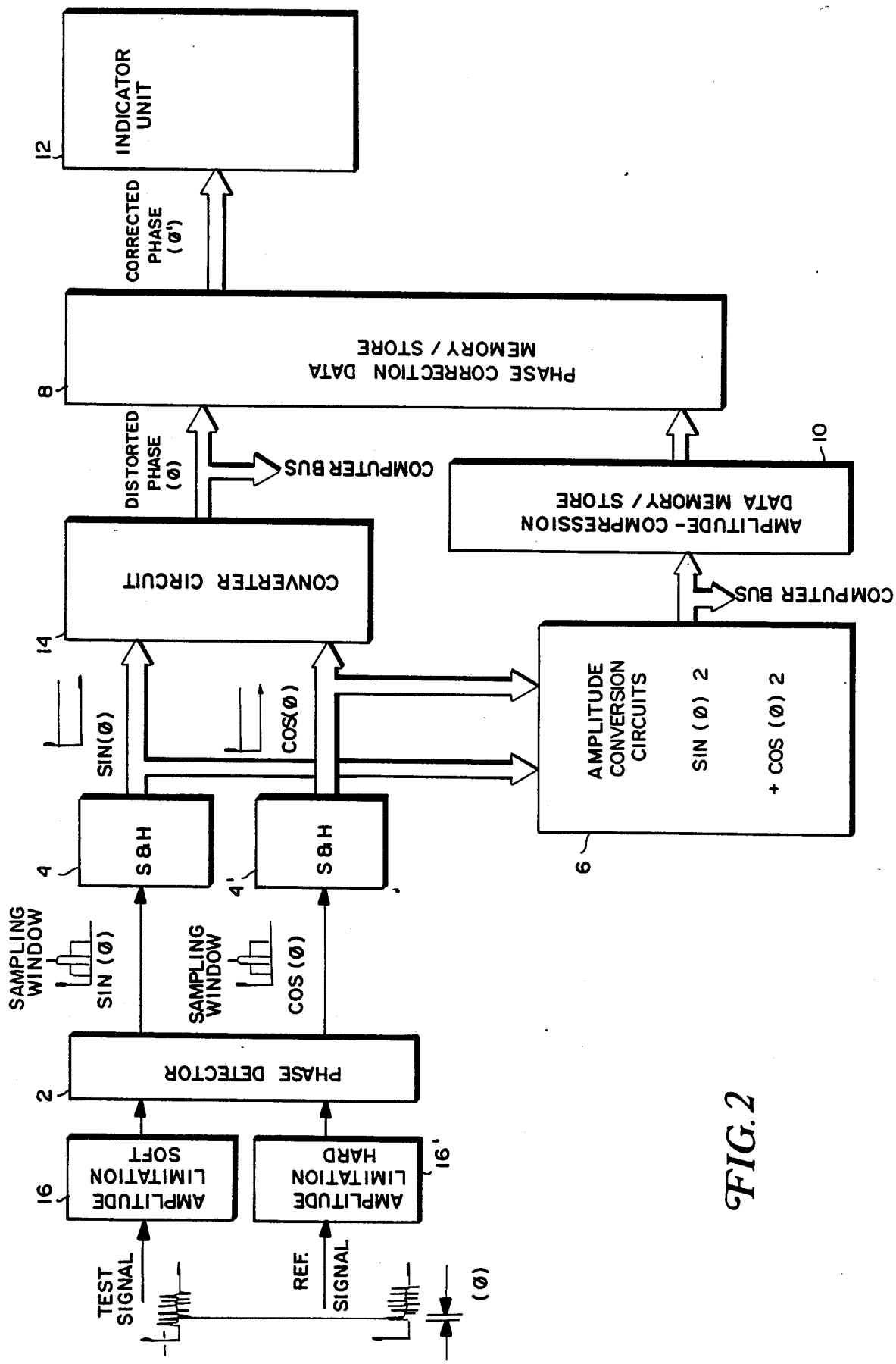
FIG. 2 is a block diagram of a second exemplary embodiment of this invention.

A second exemplary embodiment of this invention is depicted at FIG. 2 (a presently preferred embodiment, especially for higher frequency signals) wherein similar parts are referenced with the same reference numerals. Here, it will be noted that amplitude limitation circuits 16 and 16' are connected in series with the inputs to phase detector 2 so as to effect a "soft" and a "hard" amplitude limitation, respectively. Similar amplitude limiters may be used with the FIG. 1 embodiment as well.

By "soft" amplitude limitation, it is understood that the output of the limiter is still permitted to vary but as a dimensioned function of amplitude variations in the true input test signal. Accordingly, only the dynamic-range of the test signal is reduced before input to the phase detector 2 (thus effectively increasing the usable dynamic range of the overall device).

By "hard" amplitude limitation, it is understood that an approximately constant amplitude output from the limiter is produced irrespective of amplitude fluctuations on the input reference (i.e., the amplitude is "clamped" or "clipped").

In the FIG. 2 embodiment, the phase detector 2 may have, for example, two mixer circuits (not shown) which convert the high-frequency input signals into pulsed output signals, the magnitude of which are proportional respectively to sin $\phi$ and cos $\phi$. For example, a 90° phase shifter may be used in conjunction with the second mixer to produce sin $(\phi+90°)=\cos \phi$. The two sample and hold circuits 4 and 4' then measure the amplitude of such pulsed outputs by arranging a suitable sampling window within the output pulses. As will be appreciated, the width of the sampling window and its position (that is the point in time at which the sampling is made) are typically freely adjustable (e.g., with respect to the leading edge of the input signal pulses).

The sin $\phi$ and cos $\phi$ signals thus obtained may then be conventionally converted by way of a conventional converter circuit 14 (sometimes termed a "resolver") into a signal proportional to $\phi$ itself (e.g., from 0° to 360°). Nevertheless, this φ signal output from converter circuit 14 is still distorted (e.g., as was a similar signal in the FIG. 1 embodiment) and is thus used as one dimension of a multi-dimensional control input to the phase correction or compensation memory 8. In addition, it may be supplied via a computer bus directly to a computer for use (e.g., in calibration procedures used to derive and pre-store the correction-store values.

Again, in parallel to the phase measurement in control circuits mentioned above, an amplitude conversion circuit 6 is also employed. In the FIG. 2 embodiment, this circuit is connected to the output of sample and hold circuits 4 and 4' so as to receive (in either analog or digital form) the sin φ and cos φ signals. This amplitude conversion circuit 6 produces amplitude-dependent signals related to the square of test signal magnitude by using the sum of the squares of the sine and cosine signals (in accordance with the Pythagorean Theorem). Again, as in the FIG. 1 embodiment, the output from the amplitude control circuit 6 is input to a suitable amplitude-compression memory 10 which outputs a suitable second dimension (e.g., amplitude range data used to select addressed pages in memory 8) of control for the phase correction output memory 8.

Figure 3:
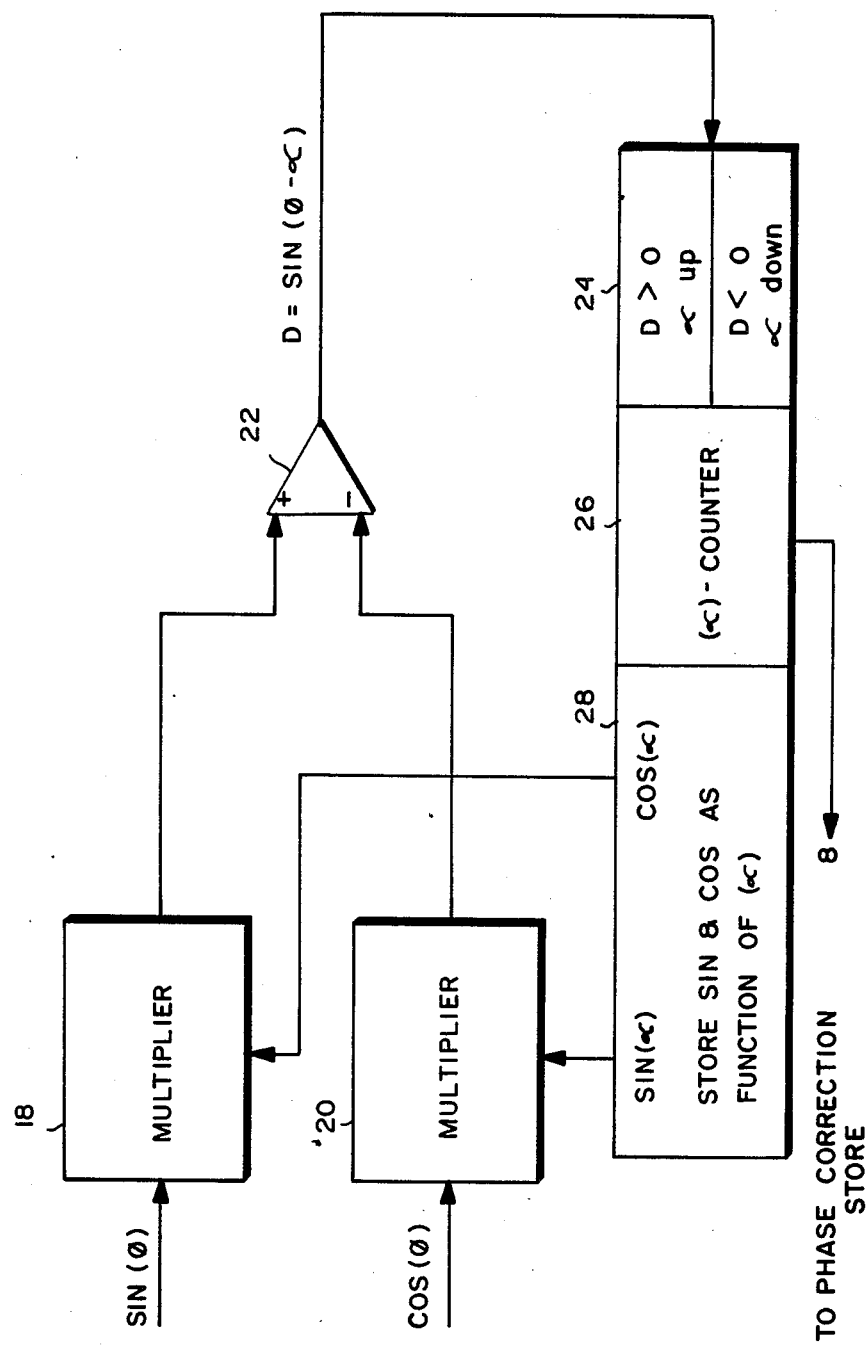
FIG. 3 is a more detailed block diagram of an exemplary angle resolver or converter circuit of a type which may used with the exemplary embodiment of FIG. 2.

Some details of a particularly suitable angle resolver circuit 14 of the FIG. 2 embodiment are shown in FIG. 3.

For example, the signal sin φ may be input to a first multiplier 18 while the signal cos φ is input to a second multiplier 20. The output of multiplier 18 is connected to the input of comparator 22 as is the output of second multiplier 20. A signal related to an angle α counter 26 (cos α) is then supplied to the first multiplier 18 while a corresponding signal sin α is supplied to the second multiplier 20 from an angular function store 28 in which, for every angle α, the sine and cosine has been pre-calculated and stored.

The appropriate angle α is selected by the α counter 26. Thus, the first multiplier 18 produces a signal related to the product (sin φ)x(cos α) while the second multiplier produces a signal related to the product (cos φ)x(sin α). Upon the subtraction of these two multiplier outputs in comparator 22, the difference is compared with respect to zero at 24 so as to control the α counter 26 in either the up or down direction. As will be appreciated, by an iterative implementation of the algorithm depicted in FIG. 3 (e.g., by a suitably programmed digital computer), the comparison circuit 24 may control the α counter 26 to increase when the output of comparator 22 is greater than zero and to decrease when it is less than zero. As a result, when a difference of zero is detected, the input angle φ corresponds to the counter angle α. Accordingly, the counter angle α can then be output as a distorted phase φ signal to the phase correction store 8.

It will be noted that since only the components of the phase detector itself are sensitive with respect to temperature fluctuations, it may be useful to accommodate the phase detector within a temperature controlled oven (not shown) which can be kept at a constant temperature by conventional heating systems. Such small heating ovens are well-known and can be obtained and used without difficulty.

While only a few exemplary embodiments of this invention have been described in detail, those skilled in the art will recognize that many variations and modifications may be made in these embodiments while yet retaining many of the novel features and advantages of this invention. Accordingly, all such variations and modifications are intended to be included within the scope of the appended claims.

What is claimed is:

1. Apparatus for accurately measuring the phase difference between two alternating current input signals, said apparatus comprising:
    phase difference measuring means for receiving said input signals and for producing a first signal as a function of the phase difference therebetween but also including predetermined distortion components related (a) to the amplitude of at least one of the input signals and (b) to the phase difference itself;
    amplitude measuring means for producing a second signal as a function of the amplitude of at least one of the input signals; and
    correction means for outputting a corrected phase difference signal as a function of said first and second signals which corrected phase difference signal is compensated for said distortion components and thereby more accurately represents the true phase difference between said input signals.

2. Apparatus as in claim 1 wherein said correction means comprises a digital signal memory having pre-stored digital output signals which are selected for output as a function of the first and second signals.

3. Apparatus as in claim 1 or 2 wherein said amplitude measuring means includes a digital signal memory having pre-stored digital second signals which are selected as a function of the measured amplitude of said at least one input signal.

4. Apparatus as in claim 3 wherein said digital second signals are selected as a function of the measured amplitudes of both said input signals.

5. Apparatus as in claim 3 wherein said amplitude measuring means produces a signal related to the first measured phase difference φ by $\sin^2 \phi + \cos^2 \phi$.

6. A measuring circuit for correcting the phase measurement of pulsed high-frequency signals, including a phase detector which has a test signal input and a reference signal input and which produces an initial phase-difference signal φ between the test signal and the reference signal which signal φ is supplied to a sample-and-hold circuit to produce therefrom a corresponding d.c. voltage, said measuring circuit being characterized by:
    a phase correction data store in which non-linearity correction data are stored for φ as a function of said d.c. voltage and as a function of input signal amplitude;
    an amplitude conversion circuit connected to the test signal input and to the reference signal input to determine the amplitude of the test signal and of the reference signal; and
    an amplitude-compression data store connected to an output of the amplitude conversion circuit which compresses the characteristic corrections which can be controlled as a function of input signal amplitudes;
    wherein the phase correction store is controlled by the output of the sample and hold circuit and by the output of the amplitude-compression data store to output corrected φ' data which is corrected for phase and amplitude dependent distortion of the characteristic phase measurement output of the phase detector.

7. A circuit according to claim 6, characterized in that signal amplitude limitation circuits are connected before the phase detector inputs to extend the usable dynamic range of the circuit.

8. A circuit according to claim 6 or 7 characterized in that the phase detector produces a signal corresponding to the cosine as well as the sine of the phase displacement $\phi$ to be measured and wherein the amplitude conversion circuit produces an amplitude-dependent signal by squaring and summing the sine and cosine signals.

9. A circuit according to claim 6 or 7 characterized in that between the sample-and-hold circuit and the phase-correction data store, a converter circuit is connected which produces a phase signal $\phi$ from the sine and cosine signals.

10. A circuit according to claim 6 or 7 characterized in that the components forming the phase detector are accommodated within an electric oven.

11. Method for accurately measuring the phase difference between two alternating current input signals, said method comprising:
 receiving said input signals an producing a first signal as a function of the phase difference therebetween but also including predetermined distortion components related (a) to the amplitude of at least one of the input signals and (b) to the phase difference itself;
 producing a second signal as a function of the amplitude of at least one of the input signals; and
 outputting a corrected phase difference signal as a function of said first and second signals which corrected phase difference signal is compensated for said distortion components and thereby more accurately represents the true phase difference between said input signals.

12. Method as in claim 11 wherein said outputting step comprises selecting pre-stored digital output signals from a memory as a function of the first and second signals.

13. Method as in claim 11 or 12 wherein said producing step includes selecting pre-stored digital second signals from a memory as a function of the measured amplitude of said at least one input signal.

14. Method as in claim 13 wherein said digital second signals are selected as a function of the measured amplitudes of both said input signals.

15. Method as in claim 13 wherein said producing step produces a signal related to the first measured phase difference $\phi$ by $\sin^2 \phi + \cos^2 \phi$.

16. A measuring method for correcting the phase measurement of pulsed high-frequency signals, using a phase detector which has a test signal input and a reference signal input and which produces an initial phase-difference signal $\phi$ between the test signal and the reference signal which signal $\phi$ is supplied to a sample-and-hold circuit to produce therefrom a corresponding d.c. voltage, said measuring method being characterized by:
 storing in a phase correction data store non-linearity correction data for $\phi$ as a function of said d.c. voltage and as a function of input signal amplitude;
 determining the amplitude of the test signal and of the reference signal; and
 storing in an amplitude-compression data store compressed characteristic corrections which can be controlled as a function of input signal amplitudes;
 wherein the phase correction store is controlled by the output of the sample and hold circuit and by the output of the amplitude-compression data store to output corrected $\phi'$ data which is corrected for phase and amplitude dependent distortion of the characteristic phase measurement output of the phase detector.

17. A method according to claim 16, characterized in that signal amplitude limitation circuits are connected before the phase detector inputs to extend the usable dynamic range of the circuit.

18. A method according to claim 16 or 17 characterized in that the phase detector produces a signal corresponding to the cosine as well as the sine of the phase displacement $\phi$ to be measured and wherein the amplitude conversion circuit produces an amplitude-dependent signal by squaring and summing the sine and cosine signals.

19. A method according to claim 16 or 17 characterized in that between the sample-and-hold circuit and the phase-correction data store, a converter circuit is connected which produces a phase signal $\phi$ from the sine and cosine signals.

20. A method according to claim 16 or 17 characterized in that the components forming the phase detector are accommodated within an electric oven.

* * * * *